(12) United States Patent
Flagello et al.

(10) Patent No.: US 7,317,506 B2
(45) Date of Patent: Jan. 8, 2008

(54) VARIABLE ILLUMINATION SOURCE

(75) Inventors: Donis George Flagello, Scottsdale, AZ (US); Robert John Socha, Campbell, CA (US); James Sherwood Greeneich, Prescott, AZ (US)

(73) Assignee: ASML Netherlands B.V., Veldhoven (NL)

( * ) Notice: Subject to any disclaimer, the term of this patent is extended or adjusted under 35 U.S.C. 154(b) by 255 days.

(21) Appl. No.: 11/091,927

(22) Filed: Mar. 29, 2005

(65) Prior Publication Data

US 2007/0013888 A1    Jan. 18, 2007

(51) Int. Cl.
G03B 27/42    (2006.01)

(52) U.S. Cl. .............. 355/53; 355/67; 355/68; 355/69

(58) Field of Classification Search .............. None
See application file for complete search history.

(56) References Cited

U.S. PATENT DOCUMENTS

| | | | | |
|---|---|---|---|---|
| 5,041,882 | A * | 8/1991 | Katoh | 257/198 |
| 5,115,335 | A * | 5/1992 | Soref | 359/248 |
| 5,178,445 | A * | 1/1993 | Moddel et al. | 349/25 |
| 5,229,872 | A * | 7/1993 | Mumola | 349/2 |
| 5,296,891 | A | 3/1994 | Vogt et al. | |
| 5,305,054 | A | 4/1994 | Suzuki et al. | |
| 5,377,037 | A * | 12/1994 | Branz et al. | 359/265 |
| 5,523,193 | A | 6/1996 | Nelson | |
| 5,638,211 | A | 6/1997 | Shiraishi | |
| 5,668,023 | A * | 9/1997 | Goossen et al. | 148/33 |
| 5,673,103 | A * | 9/1997 | Inoue et al. | 355/71 |
| 5,969,441 | A | 10/1999 | Loopstra et al. | |
| 6,046,792 | A | 4/2000 | Van Der Werf et al. | |
| 6,323,507 | B1 * | 11/2001 | Yokoyama et al. | 257/79 |
| 6,346,979 | B1 * | 2/2002 | Ausschnitt et al. | 355/53 |
| 6,429,440 | B1 * | 8/2002 | Bleeker | 250/492.1 |
| 6,452,662 | B2 | 9/2002 | Mulkens et al. | |
| 6,466,304 | B1 | 10/2002 | Smith | |
| 6,511,869 | B2 * | 1/2003 | Colgan et al. | 438/149 |
| 6,633,366 | B2 * | 10/2003 | de Jager et al. | 355/67 |
| 6,737,662 | B2 * | 5/2004 | Mulder et al. | 250/548 |
| 6,738,128 | B2 * | 5/2004 | Shima et al. | 355/52 |
| 6,741,331 | B2 * | 5/2004 | Boonman et al. | 355/67 |
| 6,758,608 | B2 * | 7/2004 | Van Arendonk et al. | 385/89 |
| 6,778,746 | B2 * | 8/2004 | Charlton et al. | 385/122 |
| 6,795,163 | B2 * | 9/2004 | Finders | 355/53 |
| 6,833,907 | B2 * | 12/2004 | Eurlings et al. | 355/71 |
| 6,847,461 | B1 * | 1/2005 | Latypov et al. | 356/520 |
| 6,855,486 | B1 * | 2/2005 | Finders et al. | 430/394 |
| 6,871,337 | B2 | 3/2005 | Socha | |
| 6,887,625 | B2 | 5/2005 | Baselmans et al. | |
| 2002/0027648 | A1 * | 3/2002 | Van Der Laan et al. | 355/71 |

(Continued)

FOREIGN PATENT DOCUMENTS

EP    0 500 393 B1    11/1997

(Continued)

Primary Examiner—Patrick Assouad
Assistant Examiner—Warren K Fenwick
(74) Attorney, Agent, or Firm—Pillsbury Winthrop Shaw Pittman LLP

(57) ABSTRACT

An apparatus and method for providing a variable illumination field for use in lithographic imaging for semiconductor manufacturing includes providing a an illumination system including a variable optical element having an array of addressable elements, each addressable element constructed and arranged to have a variable transmittance.

20 Claims, 4 Drawing Sheets

| U.S. PATENT DOCUMENTS | | | | FOREIGN PATENT DOCUMENTS | | |
|---|---|---|---|---|---|---|
| 2002/0180943 A1* | 12/2002 | Mulkens et al. ............... 355/68 | | EP | 0 486 316 B1 | 4/2000 |
| 2004/0222418 A1* | 11/2004 | Mochizuki ................... 257/59 | | EP | 0 496 891 B1 | 4/2000 |
| 2004/0229133 A1 | 11/2004 | Socha et al. | | WO | 98/33096 | 7/1998 |
| 2004/0265707 A1 | 12/2004 | Socha | | WO | 98/38597 | 9/1998 |
| 2005/0134822 A1 | 6/2005 | Socha et al. | | WO | 98/40791 | 9/1998 |
| 2005/0142470 A1 | 6/2005 | Socha et al. | | | | |
| 2007/0013890 A1* | 1/2007 | Loopstra et al. ............... 355/69 | | * cited by examiner | | |

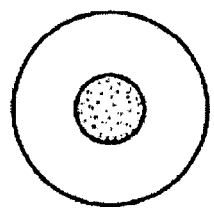
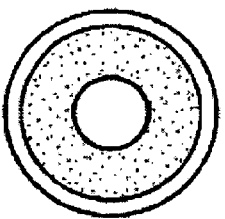
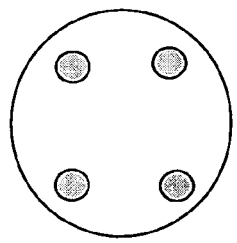
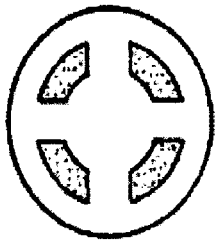
FIG. 2  FIG. 3  FIG. 4  FIG. 5
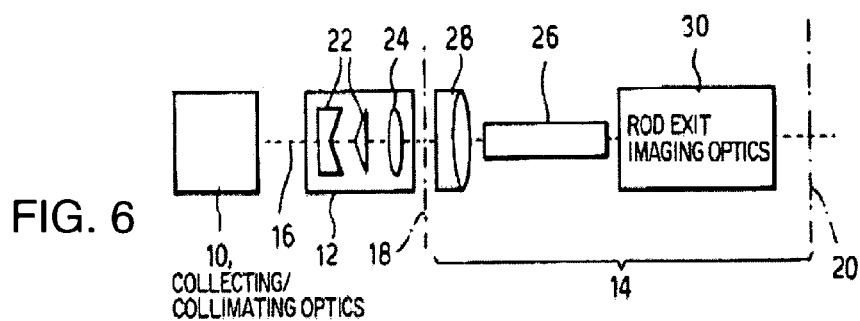
FIG. 6
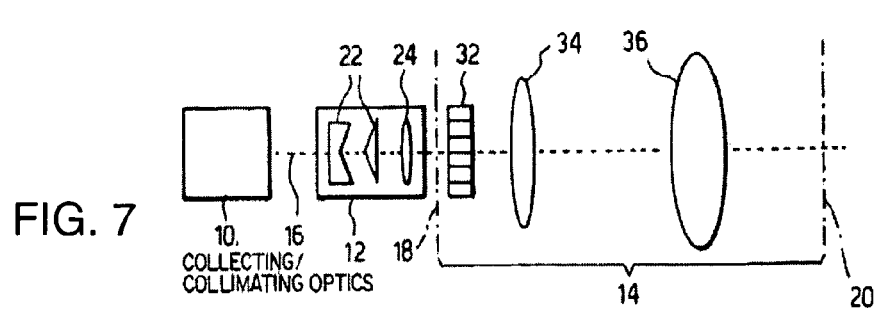
FIG. 7

VARIABLE ILLUMINATION SOURCE

BACKGROUND OF THE INVENTION

1. Field of the Invention

The present invention relates generally to an illumination source for use in lithographic apparatus and more particularly to a variably controllable illumination source.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable liquid crystal display (LCD) array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g., comprising one or more dies on a substrate (silicon wafer) that has been coated with a layer of radiation sensitive material (resist). In general, a single wafer will contain a whole network of adjacent target portions that are successively irradiated via the projection system, one at a time. In current apparatuses, employing patterning by a mask on a mask table, a distinction can be made between two different types of machines. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g., in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g., an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatuses are described, for example, in U.S. Pat. No. 5,969,441 and WO 98/40791.

In order to keep pace with Moore's law and develop features having sub-wavelength resolution, it has become necessary to use a variety of resolution enhancement techniques (RET). Historically, the Rayleigh criteria for resolution (R) and depth of focus (DOF) have been utilized to evaluate the performance of a given technology:

$$R = k_1 \lambda/NA$$

$$DOF = +/- k_2 \lambda/NA^2$$

where $k_1$ and $k_2$ are process dependent factors, $\lambda$ is wavelength, and NA is numerical aperture. Depth of focus is one of the factors determining the resolution of the lithographic apparatus and is defined as the distance along the optical axis over which the image of the pattern is adequately sharp.

The resolution limit of currently available lithographic techniques is being reached due to a decrease in the depth of focus, difficulty in the design of lenses and complexities in the lens fabrication technology. A lower limit on the value of the constant $k_1$ has thus far appeared to be approximately 0.25.

In order to improve resolution performance of a lithographic system, various tools may be used. In one approach, illumination systems are refined by considering alternatives to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination. Off-axis illumination improves resolution by illuminating the mask with radiation that is at an angle to the optical axis of the lens. The incidence of the radiation on the mask, which acts as a diffraction grating, improves the contrast of the image by transmitting more of the diffracted orders through the lens. Off-axis illumination techniques used with conventional masks produce resolution enhancement effects similar to resolution enhancement effects obtained with phase shifting masks. Besides off-axis illumination, other currently available RET include optical proximity correction (OPC) of optical proximity errors (OPE), phase shifting masks (PSM), and sub-resolution assist features (SRAF). Each technique may be used alone, or in combination with other techniques to enhance the resolution of the lithographic projection tool.

One approach to providing oblique illumination patterns is to incorporate a metal aperture plate or spatial filter into the projection system illuminator assembly. In one example, a pattern on such a metal plate would have four symmetrically arranged openings (zones) with sizing and spacing set to allow diffraction order overlap for specific geometry sizing and duty ratio on the photomask. This is known as quadrupole illumination. Such an approach results in a significant loss in intensity available to the mask, lowering throughput and making the approach less than desirable. Additionally, the four circular openings need to be designed specifically for certain mask geometry and pitch and do not improve the performance of other geometry sizes and spacings. The previous work in this area describes such a method using either two or four openings in the aperture plate. See, for example, EP 0 500 393, U.S. Pat. Nos. 5,305,054, 5,673,103, 5,638,211, EP 0 496 891 and EP 0 486 316.

Another approach to off-axis illumination using the four-zone configuration, which is disclosed in U.S. Pat. No. 6,452,662 incorporated herein by reference in its entirety, is to divide the illumination field of the projection system into beams that can be shaped to distribute off-axis illumination to the photomask. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Available illumination intensity distributions or arrangements include small, or low, sigma, annular, quadrupole, and quasar. The annular, quadrupole, and quasar illumination techniques are examples of off-axis illumination schemes.

Small sigma illumination is incident on the mask with approximately zero illumination angle (i.e., almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and quasar illumination are incident on the mask with four main angles and provide improved resolution and increased depth of focus while being strongly pattern dependent.

To improve the illumination homogeneity, an optical integrator 26 is used. In FIG. 6 the optical integrator takes the form of a light pipe 26, such as a glass, calcium fluoride or quartz rod. A coupler 28 couples the illumination at the pupil plane 18 into the rod 26, and rod exit imaging optics 30 are also provided. In FIG. 7 a fly's eye element 32 acts as the integrator. The fly's eye element 32 is a composite lens comprising an array or honeycomb of small lenses. Further, objective lenses 34 and 36 complete the projection optics.

For even more complex illumination patterns, a spatial filter having a number of transmissive regions may be used to create a dithered pattern as described in U.S. Pat. No. 6,466,304, for example. The filter of that patent, includes a translucent substrate and a masking film. The distribution of the intensity through the masking aperture in the illumination pupil plane is preconfigured to provide optimized illumination for a particular mask pattern to be imaged. The dithering allows the illumination region or regions to exhibit varying intensity, as a result of the half-tone pattern created by the pixelation of the masking film. This can allow a variation in illumination intensity beyond the simple binary (clear or opaque) possible with other pupil plane filtering approaches.

Photolithographic simulations may be used to aid in the development, optimization and use of lithographic apparatuses. They can be extremely helpful as a development tool, by quickly evaluating options, optimizing processes, and saving time and money by reducing the number of required experiments. Simulations can also be helpful in the research context for understanding many physical phenomena that occur when pushing the limits of resolution to achieve feature size in the order of or below the wavelength of the lithographic apparatus.

SUMMARY OF THE INVENTION

It is an aspect of embodiments of the present invention to provide a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate and a variable optical element forming a part of the illumination system and comprising an array of addressable element, each addressable element constructed and arranged to have a variable transmittance.

It is a further aspect of embodiments of the present invention to provide a method of imaging using a lithographic apparatus including producing a beam of radiation, varying the transmittance of a plurality of addressable elements of a variable optical element, impinging the beam of radiation on to the variable optical element thereby patterning the beam of radiation according to a desired illumination pattern, illuminating an image patterning device with the beam of radiation and projecting the beam of radiation onto a substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. It should be appreciated that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2 is a schematic illustration of a small, or low, sigma illumination arrangement;

FIG. 3 is a schematic illustration of an annular off-axis illumination arrangement;

FIG. 4 is a schematic illustration of an off-axis quadrupole illumination arrangement;

FIG. 5 is a schematic illustration if an off-axis quasar illumination arrangement;

FIG. 6 is a schematic illustration of a known illumination system;

FIG. 7 is a schematic illustration of another known illumination system;

DETAILED DESCRIPTION OF THE INVENTION

Figure 1:
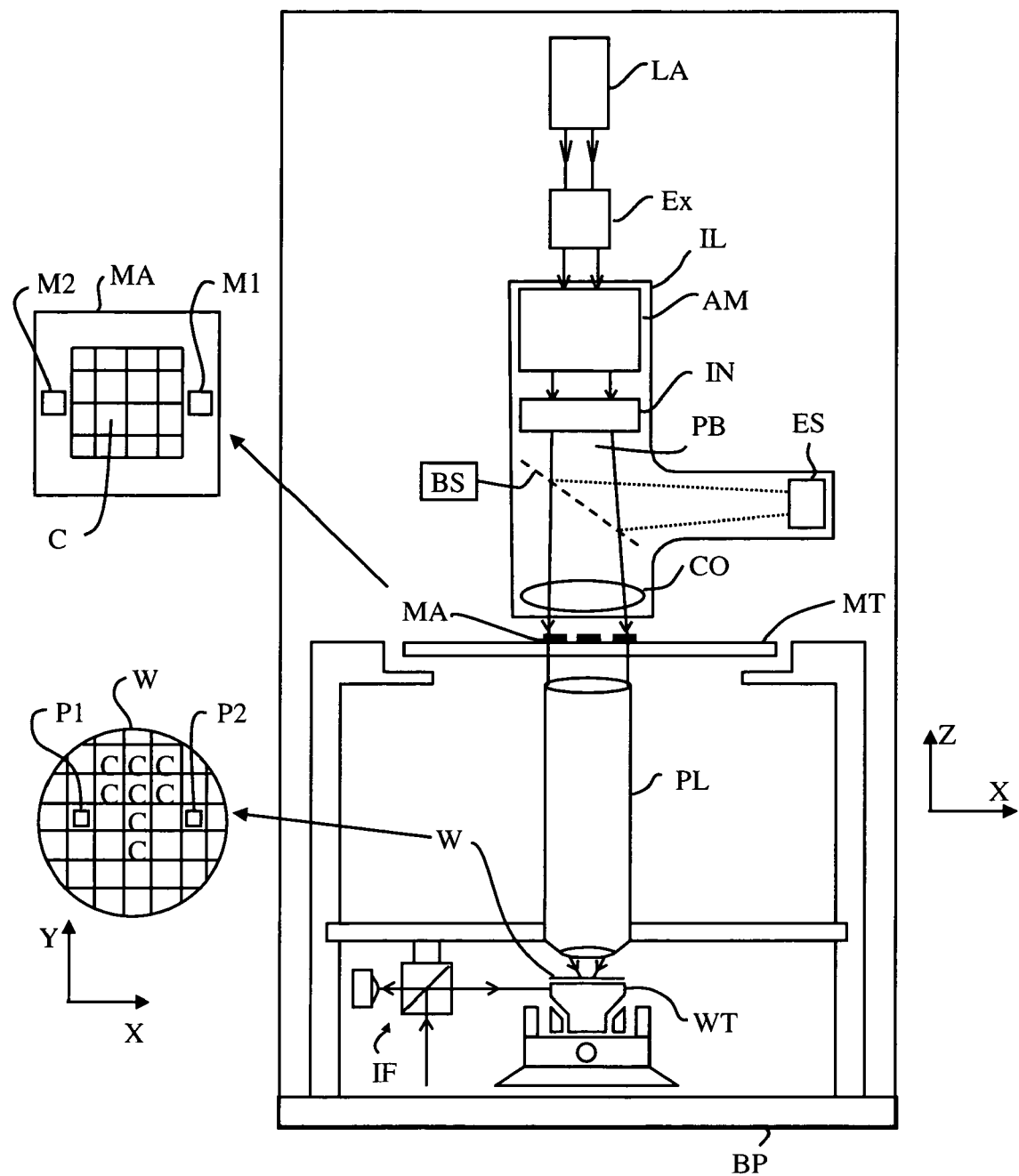
FIG. 1 is a schematic illustration of a photolithographic projection apparatus.
Figure 8:
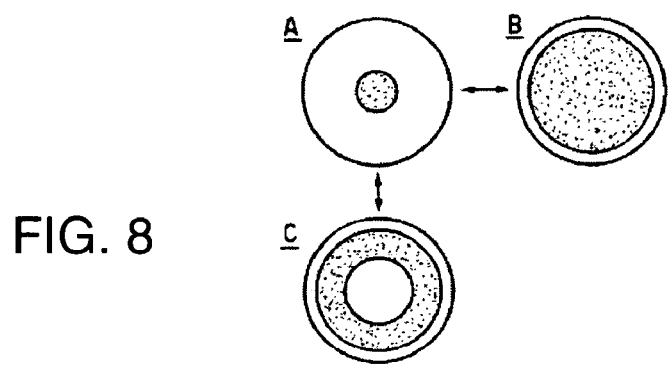
FIG. 8 is a schematic illustration of illumination arrangements obtainable with the illumination systems of FIGS. 6 and 7.

FIG. 1 schematically depicts a lithographic projection apparatus 1 according to an embodiment of the invention. The apparatus includes a radiation system Ex, IL constructed and arranged to supply a projection beam PB of radiation (e.g., UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g., a reticle), and connected to a first positioning device to accurately position the mask with respect to a projection system or lens PL; a second object (substrate) table WT provided with a substrate holder constructed and arranged to hold a substrate W (e.g., a resist-coated silicon wafer), and connected to a second positioning device to accurately position the substrate with respect to the projection system or lens PL. The projection system or lens PL (e.g., a quartz and/or CaF$_2$ lens system or a refractive or catadioptric system, a mirror group or an array of field deflectors) is constructed and arranged to image an irradiated portion of the mask MA onto a target portion C (e.g., comprising one or more dies) of the substrate W. The projection system PL is supported on a reference frame RF.

As here depicted, the apparatus is of a transmissive type (i.e., has a transmissive mask). However, in general, it may also be of a reflective type, (e.g., with a reflective mask). Alternatively, the apparatus may employ another kind of patterning device, such as a programmable mirror array of a type as referred to above.

The source LA (e.g., a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 250 nm, such as with wavelengths of 248 nm, 193 nm, 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device and interferometer IF, the substrate table WT can be moved accurately, e.g., so as to position different target portions C in the path of the beam PB. Similarly, the first positioning device can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e., a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction," e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As noted above, during imaging, it may be beneficial to select a particular illumination pattern in order to improve imaging. Contrast for certain regularly aligned features, for example may be improved by making use of multipole illumination such as dipole illumination and the two quadrupole illuminations shown in FIGS. 4 and 5.

FIGS. 4 and 5 each illustrate quadrupole illuminations in which the light poles are located in each quadrant of the illumination light pattern with centers 45° from the orthogonal lines. This orientation can produce optimal projection of the lines, particularly for dense structures, such as for DRAM-like structures. The orthogonal lines are generally referred to as horizontal and vertical. As pattern features decrease in size, light poles located in each quadrant with centers 90° from the orthogonal lines become more preferred. The optimal sigma for quadrupole illumination can be estimated from the formula:

$$\sigma = \lambda/(\sqrt{2} NA \cdot \text{pitch}), \text{ and for dipole and } 45° \text{ rotated quadrupole from:}$$

$$\sigma = \lambda/(2 NA \cdot \text{pitch})$$

Figure 9:
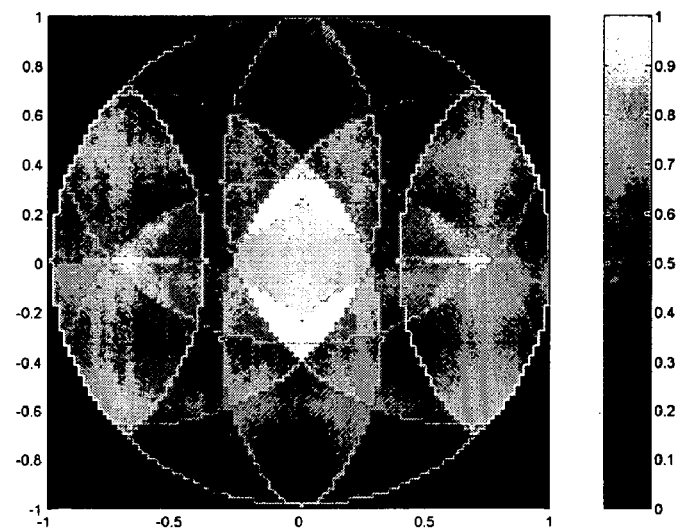
FIG. 9 is a schematic illustration of a complex illumination pattern such as may be produced in accordance with an embodiment of the present invention.

More generally, in a typical application, it is possible to calculate an optimized illumination profile for a given mask pattern. For example, the geometric and optical parameters of the lithographic apparatus may be defined and loaded in a lithography simulation software, such as Prolith™ or Solid-C™. Specifically, the characteristics of the illumination system and the illumination conditions may be defined. After running simulations, either single or iterative, a selected optimal profile may be determined. In many cases, the optimal profile for a given mask pattern will not correspond in a simple fashion to one of the types that is available using the zoom axicon arrangement described above and a metal plate aperture, or grey scale filter would normally be used. For example, as shown in FIG. 9, it may be useful to have a quite detailed illumination pattern having a number of bright spots, a number of dark spots and several regions that are somewhere in between.

Figure 10:
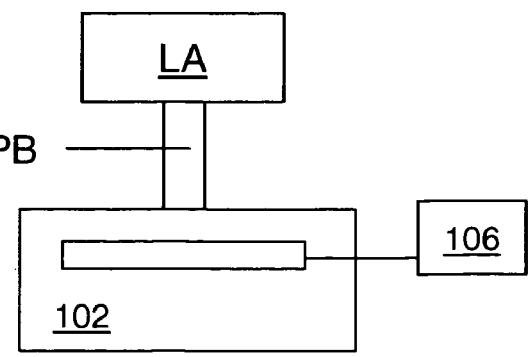
FIG. 10 is a schematic illustration of an illuminator including a variable optical element in accordance with an embodiment of the present invention.
Figure 11:
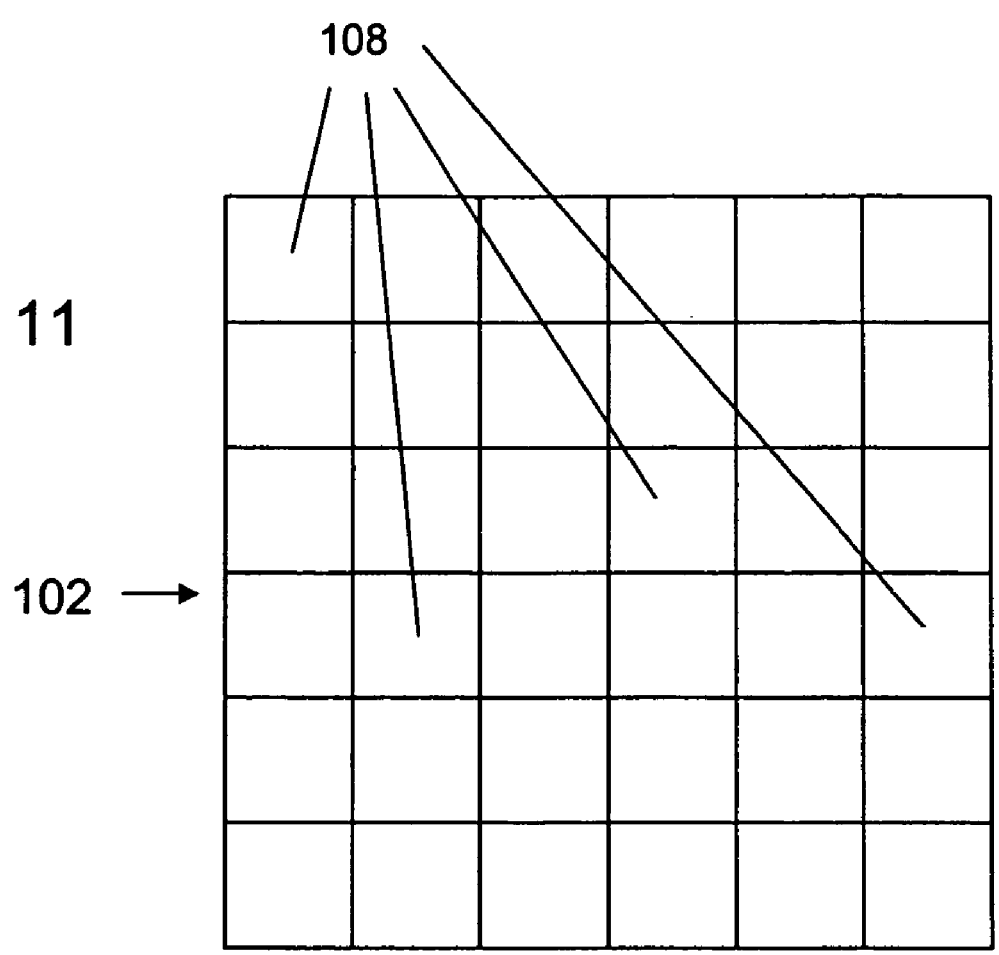
FIG. 11 is a schematic illustration of an array of addressable elements forming a variable optical element in accordance with an embodiment of the present invention.

In this case, an illumination system IL according to the present invention, as shown schematically in FIG. 10 may be employed to produce the optimized profile. As described above, a beam of radiation PB enters the illumination system IL from the source LA. A variable optical element, 102, positioned in the beam, transmits the light to a collector 104. A controller, 106 is operationally connected to the variable optical element 102 and provides, for example, electrical control signals that operate to modify the transmissivity of an array of sub-elements 108 as illustrated in FIG. 11.

In certain embodiments, the array may be an array of square or hexagonal elements, producing a fully packed planar area. This is not strictly necessary, however. Even though an array that is not closely packed would contain small dark portions in the illumination plane, these should not adversely affect imaging as the use of a uniformer or integrator IN as described above in relation to FIG. 1 will tend to eliminate the non-uniformities. The arrays may be made up of varying numbers of elements.

In embodiments of the present invention, the variable optical element 106 is a liquid crystal display (LCD) made up of an array of picture elements (pixels) that are controllable and addressable via electronic signals from, for example, controller 106. The pixels may be individually addressable, or may be addressable in groups, to create larger pixel sizes. When activated, the pixels can be changed from light (highly transmissive) to dark (substantially opaque). Though these two states can be considered to be on and off, in practice, they will rarely correspond to 100% and 0% transmission due to the material constraints of the LCD array.

Furthermore, it can be useful to make use of an LCD that is capable of several intermediate states in addition to the on and off states in order to allow for a grey scale illumination. For example, each picture element may be capable of 4, 8, 16, 32, 64 or even more different levels of light transmission.

In an alternate arrangement, the variable optical element 102 may be made up of an array of heterojunction regions.

Each heterojunction region may be individually addressable, or the regions may be grouped into larger picture elements.

Each heterojunction region has a characteristic band gap and an inherent transmittance for the wavelength or range of wavelengths used for imaging in the lithographic apparatus. In this embodiment, the controller 106 applies a voltage to the heterojunctions in order to vary the band gap. By varying the voltage applied to the junction, either by changing the magnitude or by reversing the voltage, the band gap is altered, thereby altering the optical density of the heterojunction material. A change in the optical density corresponds to a change in transmissivity, thereby providing for a variable illumination field. In particular, optical density can be expressed as $\log_{10}(1/T)$, where T is the transmittance of the material. Thus, the higher the optical density, the lower the transmittance. Examples of heterojunction materials that may find use in the present invention include Si and SiGe materials usually along with appropriate doping constituents.

As with the LCD embodiment, the heterojunction embodiment may be used in an application in which each pixel is in either an on or an off state (substantially 100% or substantially 0% transmission respectively) or in an application in which the pixel varies between an on and an off state.

In the case that the elements of the variable optical element are picture elements (pixels) of an LCD, such arrays are commercially available with up to one thousand or more elements per side. However, such a high number of elements is not required for useful results. Arrays of 32×32 or 128×128 can provide a sufficient degree of variability in illumination pupils produced. Furthermore, a smaller array becomes simpler to control. Likewise, numerical modeling of the illumination pattern is performed more easily for relatively small arrays.

While specific embodiments of the invention have been described above, it will be appreciated that the invention may be practiced other than as described. The description is not intended to limit the invention.

What is claimed is:

1. A lithographic projection apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a variable optical element forming a part of the illumination system and comprising an array of addressable elements, each addressable element constructed and arranged to have a variable transmittance.

2. An apparatus according to claim 1, further comprising a controller, configured and arranged to produce control signals for controlling the addressable elements of the variable optical element such that at a pupil plane of the patterning device, a selected illumination pattern is formed.

3. An apparatus according to claim 2, wherein the selected illumination pattern is selected based at least in part on the pattern of the patterned radiation beam.

4. An apparatus according to claim 1, wherein the addressable elements comprise picture elements of a liquid crystal display panel.

5. An apparatus according to claim 4, wherein the picture elements of the liquid crystal display panel have a first, on, state and a second, off state.

6. An apparatus according to claim 4, wherein the picture elements of the liquid crystal display panel have a plurality of states, wherein the transmittance of the picture elements varies between about 0 and about 1.

7. An apparatus according to claim 1, wherein each addressable element comprises a heterojunction having a band gap and wherein the transmittance of the heterojunction is variable by changing the band gap.

8. An apparatus according to claim 7, wherein the band gap is changeable by changing a voltage applied to the heterojunction.

9. An apparatus according to claim 8, wherein the changing a voltage comprises changing an amplitude of the voltage.

10. An apparatus according to claim 8, wherein the changing a voltage comprises reversing the voltage.

11. A method of imaging a pattern onto a substrate comprising:
    producing a beam of radiation;
    varying the transmittance of a plurality of addressable elements of a variable optical element;
    impinging the beam of radiation on to the variable optical element thereby patterning the beam of radiation according to a desired illumination pattern;
    after the patterning according to the desired illumination pattern, illuminating an image patterning device with the beam of radiation; and
    after the illuminating, projecting the beam of radiation onto the substrate.

12. A method of imaging according to claim 11 wherein the variable optical element forms the desired illumination pattern at a pupil plane of the patterning device.

13. A method according to claim 11, wherein the addressable elements comprise picture elements of a liquid crystal display panel.

14. A method according to claim 11, further comprising selecting the desired illumination pattern based at least in part on a pattern of the image patterning device.

15. A method according to claim 13 wherein the varying the transmittance of the addressable elements further comprises switching the picture elements between an off state and an on state.

16. A method according to claim 13, wherein the varying the transmittance of the addressable elements further comprises varying the picture elements among a plurality of states between and including an off state and an on state.

17. A method according to claim 11, wherein the addressable elements comprise a heterojunction having a band gap and wherein the varying the transmittance of the addressable elements further comprises changing the band gap.

18. A method according to claim 17, wherein the changing the band gap further comprises changing a voltage applied to the band gap.

19. A method according to claim 18, wherein the changing the voltage comprises changing an amplitude of the voltage and/or reversing the voltage.

20. A semiconductor device manufactured according to the method of claim 12.

* * * * *